United States Patent
Kagami et al.

(10) Patent No.: US 7,652,854 B2
(45) Date of Patent: Jan. 26, 2010

(54) MAGNETO-RESISTIVE OR TUNNELING MAGNETO-RESISTIVE ELEMENT HAVING A SHIELDING FILM OF AN AMORPHOUS LAYER ABOVE A CRYSTALLINE LAYER, AND METHOD FOR MANUFACTURING THE SAME

(75) Inventors: Takeo Kagami, Tokyo (JP); Naoki Ohta, Tokyo (JP); Kazuki Sato, Tokyo (JP); Satoshi Miura, Tokyo (JP)

(73) Assignee: TDK Corporation, Tokyo (JP)

( * ) Notice: Subject to any disclaimer, the term of this patent is extended or adjusted under 35 U.S.C. 154(b) by 630 days.

(21) Appl. No.: 11/500,311

(22) Filed: Aug. 8, 2006

(65) Prior Publication Data
US 2007/0035886 A1 Feb. 15, 2007

(30) Foreign Application Priority Data
Aug. 9, 2005 (JP) .............................. 2005-230417

(51) Int. Cl.
*G11B 5/33* (2006.01)
(52) U.S. Cl. ................. 360/319; 360/324.2; 29/603.07; 29/603.14
(58) Field of Classification Search ......... 360/313–328; 428/810–816; 257/421–427; 365/158, 145, 365/171–173
See application file for complete search history.

(56) References Cited

U.S. PATENT DOCUMENTS

| 6,903,908 B2 * | 6/2005 | Hayashi et al. ........... 360/324.2 |
| 7,342,751 B2 * | 3/2008 | Nagasaka et al. ......... 360/324.1 |
| 2007/0188944 A1 * | 8/2007 | Hoshino et al. ......... 360/324.12 |

OTHER PUBLICATIONS

Stuart S.P. Parkin, et al., "Giant Tunnelling Magnetoresistance at Room Temperature with MgO (100) Tunnel Barriers", Nature Materials, vol. 3, No. 12, Dec. 2004, pp. 862-867.
AIST Today, National Institute of Advanced Industrial Science and Technology, vol. 4, No. 5, May 2004, pp. 4-6 and 2 cover pages.
U.S. Appl. No. 11/760,149, filed Jun. 8, 2007, Ohta et al.

* cited by examiner

*Primary Examiner*—A. J. Heinz
(74) *Attorney, Agent, or Firm*—Oblon, Spivak, McClelland, Maier & Neustadt, L.L.P.

(57) ABSTRACT

A tunneling magneto-resistive element includes: a tunneling magneto-resistive film including an antiferromagnetic layer, a pinned layer, a barrier layer and a free layer; and a lower magnetic shielding film disposed below the tunneling magneto-resistive film with respect to a lamination direction. The barrier layer is constituted of magnesium oxide. The lower magnetic shielding film has a multi-layer structure including a crystalline layer and an amorphous layer disposed above the crystalline layer with respect to the lamination direction. The crystalline layer contains at least one crystal grain having a grain size of 500 nm or more.

12 Claims, 3 Drawing Sheets

MAGNETO-RESISTIVE OR TUNNELING MAGNETO-RESISTIVE ELEMENT HAVING A SHIELDING FILM OF AN AMORPHOUS LAYER ABOVE A CRYSTALLINE LAYER, AND METHOD FOR MANUFACTURING THE SAME

BACKGROUND OF THE INVENTION

1. Field of the Invention

The present invention relates to a magneto-resistive element, a tunneling magneto-resistive element, a magnetic head device using the element, a magnetic recording/reproducing apparatus using the magnetic head device, and a method for manufacturing the element.

2. Description of the Related Art

Tunneling magneto-resistive (TMR) elements have been developed as a magneto-resistive (MR) element with high magneto resistance ratio. In tunneling magneto-resistive elements, an ultra-thin barrier layer, which is mainly constituted of metal oxide, is disposed between a free layer and a pinned layer. Above and below a tunneling magneto-resistive film, which is a lamination of an antiferromagnetic layer, the pinned layer, the barrier layer and the free layer, there are disposed a pair of magnetic shielding layers to prevent degradation of reading characteristics due to external magnetic field.

For the barrier layer, there have been widely used amorphous oxides such as aluminum oxide, titanium oxide, tantalum oxide, zirconium oxide and hafnium oxide. In recent years, however, it has been found that MR ratio can be significantly enhanced by constituting the barrier layer of crystalline magnesium oxide (MgO), as described in "Single-Crystal TMR (Tunneling Magneto-Resistive) Element with World's Highest Performance," AIST Today, vol. 4, no. 5, pp. 4-6, National Institute of Advanced Industrial Science and Technology (May 2004).

In addition, attempts have been made to enhance MR ratio of current perpendicular to plane type giant magneto-resistive (CPP-GMR) element by using a half-metal material with high polarizability (e.g., Heusler alloy).

In the conventional case where the barrier layer is constituted of amorphous oxides, annealing at a temperature of 250 to 300° C. is sufficient to stabilize the exchange coupling between the antiferromagnetic layer and the pinned layer or to stabilize the barrier layer. In the case where the barrier layer is constituted of magnesium oxide for enhancement of MR ratio, on the other hand, it is preferred that annealing is performed at a higher temperature to obtain sufficient MR ratio by enhancing crystallinity. Also in the CPP-GMR element, annealing at a higher temperature is desirable to obtain sufficient MR ratio by ordering of Heusler alloy. However, high-temperature annealing may grow coarse grains within the magnetic shielding layer, affecting the adjacent tunneling magneto-resistive film to have irregularities, thereby causing a problem of variance in characteristics.

SUMMARY OF THE INVENTION

The present invention has been developed in view of the foregoing problem and has an object to provide a tunneling magneto-resistive element which can be subjected to a high-temperature annealing treatment even though its barrier layer contains magnesium oxide and a magneto-resistive element such as a CPP-GMR element which can be subjected to a high-temperature annealing treatment even though its free layer or pinned layer contains of Heusler alloy.

According to a first aspect of the present invention, there is provided a magneto-resistive element comprising:

a magneto-resistive film; and a lower magnetic shielding film disposed below said magneto-resistive film with respect to a lamination direction, wherein said lower magnetic shielding film has a multi-layer structure including a crystalline layer and an amorphous layer disposed above said crystalline layer with respect to said lamination direction, and said crystalline layer contains at least one crystal grain having a grain size of 500 nm or more.

According to a second aspect of the present invention, there is provided a tunneling magneto-resistive element comprising:

a tunneling magneto-resistive film including an antiferromagnetic layer, a pinned layer, a barrier layer and a free layer; and a lower magnetic shielding film disposed below said tunneling magneto-resistive film with respect to a lamination direction, wherein said lower magnetic shielding film has a multi-layer structure including a crystalline layer and an amorphous layer disposed above said crystalline layer with respect to said lamination direction, and said crystalline layer contains at least one crystal grain having a grain size of 500 nm or more.

Concerning the terms "above" and "below", it should be noted that a lower layer or film is laminated prior to an upper layer or film.

According to a third aspect of the present invention, there is provided a magnetic head device including the magneto-resistive element or the tunneling magneto-resistive element as a read element.

According to a fourth aspect of the present invention, there is provided a magnetic recording/reproducing apparatus including the magnetic head device and a magnetic recording medium.

According to a fifth aspect of the present invention, there is provided a method for manufacturing a magneto-resistive element, comprising:

forming a crystalline layer as one layer constituting a lower magnetic shielding film;

forming an amorphous layer above said crystalline layer as another layer constituting said lower magnetic shielding film;

forming a magneto-resistive film above said amorphous layer; and performing high-temperature main-annealing at a temperature exceeding 300.

According to a sixth aspect of the present invention, there is provided a method for manufacturing a tunneling magneto-resistive element, comprising:

forming a crystalline layer as one layer constituting a lower magnetic shielding film;

forming an amorphous layer above said crystalline layer as another layer constituting said lower magnetic shielding film;

forming a tunneling magneto-resistive film above said amorphous layer, said tunneling magneto-resistive film including an antiferromagnetic layer, a pinned layer, a barrier layer and a free layer; and performing high-temperature main-annealing at a temperature exceeding 300° C.

After forming the crystalline layer or the amorphous layer and before forming the tunneling magneto-resistive film, sub-annealing may be performed to form at least one crystal grain having a grain size of 500 nm or more in the crystalline layer.

In this case, preferably, after the sub-annealing and before forming the tunneling magneto-resistive film, planarization is performed.

The barrier layer may be constituted of magnesium oxide.

According to the present invention, as has been described above, high-temperature annealing can be performed even though the barrier layer of the tunneling magneto-resistive element contains magnesium oxide.

The present invention will be more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
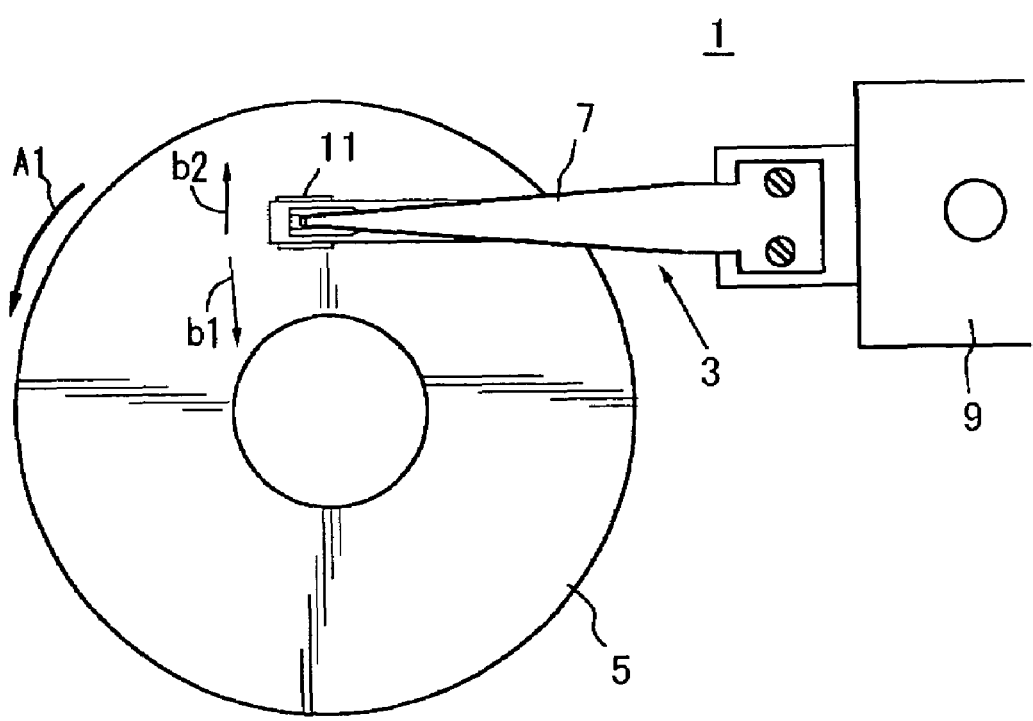
FIG. 1 is a plan view of a thin film magnetic head according to one embodiment of the present invention.

Hereinbelow embodiments of a tunneling magneto-resistive element of the present invention and a thin film magnetic head using the tunneling magneto-resistive element as a read element will be described with reference to the accompanying drawings. In the drawings, the same or corresponding portions will be designated by the same reference numerals.

FIG. 1 is a plan view of a magnetic recording/reproducing apparatus 1. The illustrated magnetic recording/reproducing apparatus 1 includes a magnetic head device 3 and a magnetic disk 5. The magnetic head device 3 at least includes a head support device 7, a positioning device 9 and a magnetic head 11. One end of the head support device 7 is connected to the positioning device 9. The magnetic head 11 is supported by the other end of the head support device 7 to face a magnetic recording surface of the magnetic disk 5.

In the magnetic recording/reproducing apparatus 1 thus constructed, when the magnetic disk 5 is driven to rotate in the direction of arrow A1 by a driving mechanism (not shown), the magnetic head 11 flies over the surface of the magnetic disk 5 at a low flying height. When the positioning device 9 is driven, the magnetic head 11 is moved in the radial direction b1 or b2 of the magnetic disk 5 through the head support device 7, performing writing/reading of magnetic data in a specified track position on the magnetic disk 5.

Figure 2:
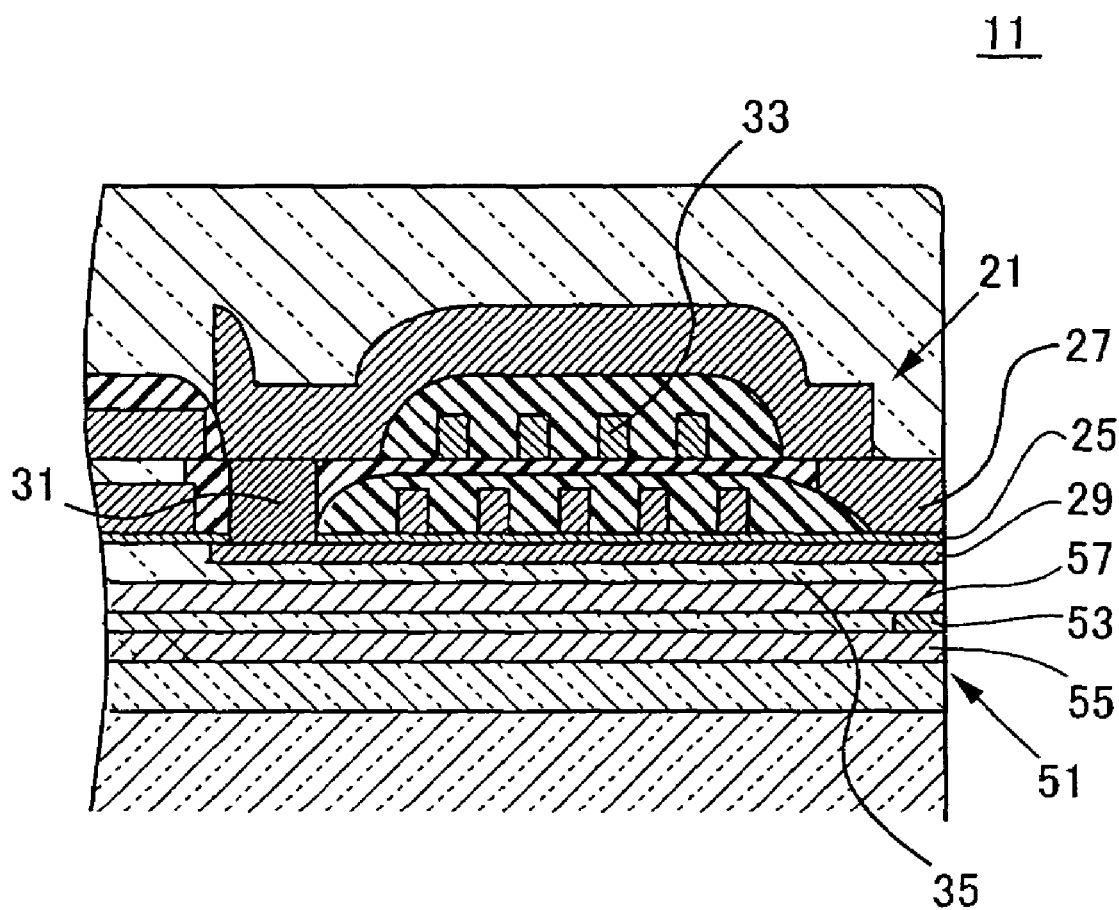
FIG. 2 is an enlarged sectional view of the thin film magnetic head of FIG. 1 around a write element and a rear element.

FIG. 2 is a sectional view showing an end of the magnetic head 11 on the medium-facing surface side. The magnetic head 11 includes a write element 21 and a tunneling magneto-resistive element 51 as a read element.

The write element 21 has a gap film 25. Above and below the gap film 25, there are disposed upper and lower magnetic pole films 27, 29. On the side opposite to the medium-facing surface, the upper and lower magnetic pole films 27, 29 are connected to each other through a connecting portion 31, thereby forming a magnetic circuit. Between the upper and lower magnetic pole films 27, 29, there is formed a coil 33. The coil 33 is disposed to wind around the connecting portion 31.

The tunneling magneto-resistive element 51, which is a read element, is disposed below the write element 21 with a nonmagnetic film 35 therebetween.

It should be appreciated that the above-described structures of the magnetic recording/reproducing apparatus and the magnetic head are mere examples and may be suitably changed.

Figure 3:
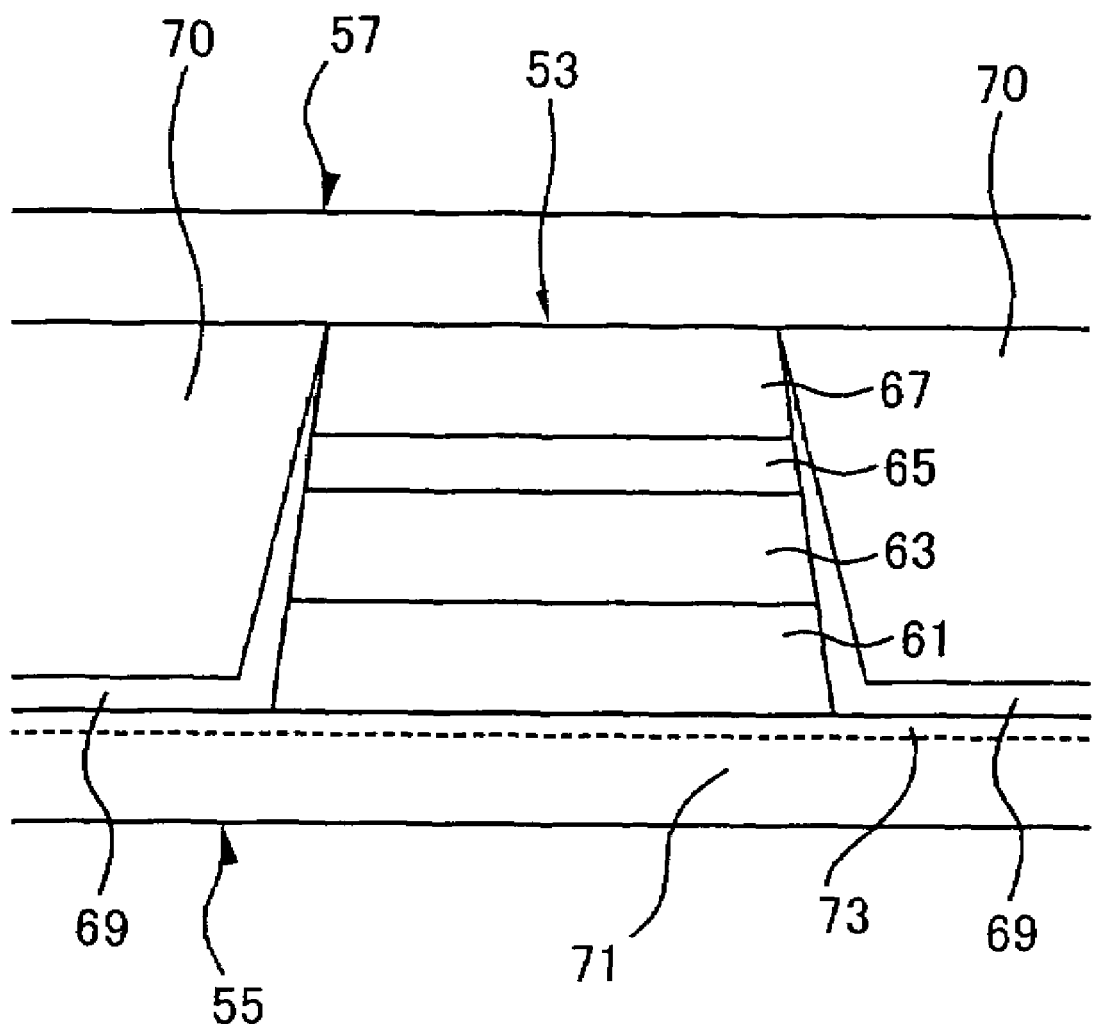
FIG. 3 is a diagram showing a structure of a tunneling magneto-resistive element according to one embodiment of the present invention.

FIG. 3 schematically shows the structure of the tunneling magneto-resistive element 51. The tunneling magneto-resistive element 51 includes a tunneling magneto-resistive film 53 and a pair of lower and upper magnetic shielding films 55, 57. The tunneling magneto-resistive film 53 includes an antiferromagnetic layer 61, a pinned layer 63, a barrier layer 65 and a free layer 67. On both sides of the tunneling magneto-resistive film 53, there are disposed an insulation layer 69 and a bias layer 70.

The direction of magnetization of the pinned layer 63 is pinned in one direction by exchange coupling between the pinned layer 63 and the antiferromagnetic layer 61, which is disposed on the side opposite to the barrier layer 65. On the other hand, the direction of magnetization of the free layer 67 is allowed to change depending on external magnetic field such as a magnetic flux from a recording medium.

The barrier layer 65 is a layer which functions as a tunnel barrier layer and is constituted of crystalline magnesium oxide (hereinafter merely called "MgO" or "magnesium oxide") which is a material with high MR ratio. The pinned layer 63 and the free layer 67 may be constituted of a ferromagnetic material such as CoFe and CoFeB.

The lower magnetic shielding film 55, which is disposed below the tunneling magneto-resistive film 53 with respect to the lamination direction, has a multi-layer structure including a crystalline layer 71 and an amorphous layer 73. The crystalline layer 71 may be constituted of an alloy such as NiFe, FeCo and FeCoNi. In addition, the crystalline layer 71 preferably has a thickness of 0.5 to 2.0 μm and contains at least one crystal grain having a grain size of 500 nm or more.

The amorphous layer 73, which is disposed above the crystalline layer 71 with respect to the lamination direction, may be constituted of an Co, Fe and Ni-based amorphous alloy containing suitable amounts of additional elements such as B, C, Si, P, Zr, La, Hf, Ta and rare-earth elements such as Gd, Ho, Tb. The amorphous layer 73 preferably has a thickness of 0.05 to 0.3 μm. It should be noted that in the present invention, a layer containing fine crystal grains is also considered as an amorphous layer as long as the grain size does not exceed 10 nm.

In the present embodiment, the upper magnetic shielding film 57 may be constituted as in the prior art without particular limitations.

Next there will be described a method for manufacturing a tunneling magneto-resistive element having the above-described structure. Because the layers below the lower magnetic shielding film 55 can be formed in the same manner as in the prior art, its description is omitted. In forming the lower magnetic shielding film 55, at first, the crystalline layer 71 as one constituent layer is formed such as by a well-known plating process. Then the amorphous layer 73 is formed above the crystalline layer 71 with respect to the lamination direction. The amorphous layer 73 may be formed by a dry deposition process, e.g., sputtering.

Above the lower magnetic shielding film 55 with respect to the lamination direction, there is formed the tunneling magneto-resistive film 53. Specifically, the antiferromagnetic layer 61 is first formed, and then, the pinned layer 63, the barrier layer 65, the free layer 67 and a cap layer (not shown) are formed in order. Here it is preferable to form a suitable foundation layer on the lower magnetic shielding film 55 prior to the formation of the antiferromagnetic layer 61.

Then, patterning the tunneling magneto-resistive film 53 is performed. In more detail, the tunneling magneto-resistive film 53 may be patterned as shown in FIG. 3 in such a manner that a masking device is disposed above the free layer 67 constituting the tunneling magneto-resistive film 53 and unnecessary parts of the antiferromagnetic layer 61, the pinned layer 63, the barrier layer 65 and the free layer 67 are removed such as by etching.

Subsequently, high-temperature annealing is performed at a temperature exceeding 300° C., preferably at a temperature of 360° C., to enhance crystallinity of the barrier layer 65. This is because the MR ratio increases rapidly in MgO (magnesium oxide) barrier layer when the temperature of annealing exceeds 300° C., as described in "Giant Tunneling Magnetoresistance at Room Temperature with MgO(100) Tunnel Barriers," by Stuart S. P. Parkin, Christian Kaiser, Alex Panchula, Philip M. Rice, Brian Hughes, Mahesh Samant, See-Hun Yang, Nature Materials, vol. 3, no. 12, pp. 862-867, FIG. 3, Nature Publishing Group (Dec. 1, 2004). On the other hand, when annealing is performed at a temperature exceeding 360° C., interdiffusion will start to thereby decrease the MR ratio. In the present invention, therefore, high-temperature annealing is performed at a temperature exceeding 300° C., preferably at a temperature of 360° C.

Thereafter, the insulation layer 69 and the bias layer 70, which may be constituted of CoCrPt, are formed on both sides of the tunneling magneto-resistive film 53 where unnecessary parts are removed by etching. Then, the upper magnetic shielding film 57 is formed above the tunneling magneto-resistive film 53 and the bias layer 70 to obtain the structure shown in FIG. 3. It should be noted that high-temperature annealing may be performed at any time after the formation of the barrier layer 65. For example, it may be performed after the formation of the insulation layer 69 or before patterning of the tunneling magneto-resistive film 53.

The above-described tunneling magneto-resistive element and its manufacturing method have the following advantages. As set forth above, annealing at a temperature exceeding 300° C. for enhancement of MR ratio in the MgO (magnesium oxide) barrier layer may form coarse grains within the crystalline layer 71, which is one constituent layer of the lower magnetic shielding film 55. This phenomenon will never occur in the prior art where annealing is performed at a temperature of 250 to 300° C., but if such coarse grains grew in a lower magnetic shielding film where a crystalline layer is disposed immediately beneath the tunneling magneto-resistive film as in the prior art, the tunneling magneto-resistive film would be affected to have irregularities, thereby causing a problem of variance in characteristics.

In the present embodiment, on the other and, the lower magnetic shielding film 55 has a multi-layer structure including the crystalline layer 71 and the amorphous layer 73 above it. Since high-temperature annealing at a temperature exceeding 300° C., which may form coarse grains within the crystalline layer 71, hardly causes coarsening in the amorphous layer 73, the effect of the coarse grains grown within the crystalline layer 71 can be canceled by the amorphous layer 73, thereby preventing the tunneling magneto-resistive film 53 from being affected by coarsening in the crystalline layer 71. Thus, the deterioration of characteristics due to coarsening can be avoided while enhancing the MR ratio of the tunneling magneto-resistive element 51 by high-temperature annealing at a temperature exceeding 300° C. That is, the tunneling magneto-resistive element according to one embodiment of the present invention and its manufacturing method enable high-temperature annealing even though the barrier layer contains magnesium oxide.

Moreover, in the case where the upper portion of the lower magnetic shielding film is crystalline and the tunneling magneto-resistive film is formed thereon, as in the prior art, if the crystal orientation is not uniform in the crystalline portion of the lower magnetic shielding film, the tunneling magneto-resistive film may follow the undesired crystal structure to cause deterioration of characteristics. In the present embodiment, however, since the upper portion of the lower magnetic shielding film 55 is the amorphous layer 73, the crystal structure of the underlying crystalline layer 71 can be canceled by the amorphous layer 73, thereby preventing the tunneling magneto-resistive film 53 from deteriorating in characteristics.

Concerning the shielding effect of the magnetic shielding film, initial permeability increases with the grain size of the crystal grain; in the present embodiment, the crystalline layer 71 of the lower magnetic shielding film 55 contains at least one crystal grain having a grain size of 500 nm or more. Therefore, although the lower magnetic shielding film 55 has an amorphous structure for enabling high-temperature annealing at a temperature exceeding 300° C., as set forth above, the lower magnetic shielding film 55 ensures necessary initial permeability as a whole, thereby ensuring suitable resistance to external magnetic field.

Here, if the grain size is large in proximity to the tunneling magneto-resistive film 53, there is a possibility of causing so-called deterioration of high-frequency characteristics. In the present embodiment, however, somewhat large crystal grains will be contained only within the crystalline layer 71, which is not the upper portion of the lower magnetic shielding film 55 but the lower portion remote from the tunneling magneto-resistive film 53. This will never result in deterioration of high-frequency characteristics.

Furthermore, the lower magnetic shielding film 55 does not have a single-layer structure composed of an amorphous layer but has a two-layer structure composed of the amorphous layer 73 and the crystalline layer 71. Since the amorphous layer 73 doesn't have to be thick, it may be formed by a dry deposition process. On the other hand, the crystalline layer 71 may be formed by a well-known plating process. Thus, the dry deposition process can be introduced while ensuring the film thickness necessary for the magnetic shielding film, which also presents an advantage in production cost.

While the present invention has been particularly shown and described with reference to the preferred embodiment, it will be understood by those skilled in the art that various changes in form and detail may be made therein without departing from the spirit, scope and teaching of the invention.

For example, after forming the crystalline layer 71 of the lower magnetic shielding film 55, sub-annealing may be performed separately from the foregoing annealing (hereinafter referred to as "main-annealing") at an appropriate time before laminating the tunneling magneto-resistive film 53.

In an alternative embodiment, after forming the crystalline layer 71 by a plating process and forming the amorphous layer 73 by sputtering, sub-annealing may be performed at a higher temperature (e.g., 380° C.) than main-annealing. Then, after laminating the tunneling magneto-resistive film 53, main-annealing may be performed as set forth above.

In another alternative embodiment, after forming the crystalline layer 71 by a plating process, sub-annealing may be performed for example at a temperature of 380° C., followed by subjecting the upper surface of the crystalline layer 71 to planarization such as CMP. Then, after forming the amorphous layer 73 by sputtering and laminating the tunneling magneto-resistive film 53, main-annealing may be performed as set forth above.

In these alternative embodiments, sub-annealing accelerates coarsening in the crystalline layer 71, but main-annealing is later performed at a lower temperature than sub-annealing, which prevents further coarsening in the crystalline layer 71 during main-annealing.

A magneto-resistive element (for example, a CPP-GMR element and a tunneling magneto-resistive element) of the present invention is applicable not only to thin-film magnetic heads but also to many multi-layer structures containing oxides, such as sensors, memories, actuators and semiconductor devices.

What is claimed is:

1. A magneto-resistive element comprising:
    a magneto-resistive film; and
    a lower magnetic shielding film disposed below said magneto-resistive film with respect to a lamination direction,
    wherein said lower magnetic shielding film has a multi-layer structure including a crystalline layer and an amorphous layer disposed above said crystalline layer with respect to said lamination direction, and said crystalline layer contains at least one crystal grain having a grain size of 500 nm or more.

2. A magnetic head device including the magneto-resistive element of claim 1 as a read element.

3. A magnetic recording/reproducing apparatus including the magnetic head device of claim 2 and a magnetic recording medium.

4. A tunneling magneto-resistive element comprising:
    a tunneling magneto-resistive film including an antiferromagnetic layer, a pinned layer, a barrier layer and a free layer; and
    a lower magnetic shielding film disposed below said tunneling magneto-resistive film with respect to a lamination direction,
    wherein said lower magnetic shielding film has a multi-layer structure including a crystalline layer and an amorphous layer disposed above said crystalline layer with respect to said lamination direction, and said crystalline layer contains at least one crystal grain having a grain size of 500 nm or more.

5. A tunneling magneto-resistive element of claim 4, wherein said barrier layer is constituted of magnesium oxide.

6. A magnetic head device including the tunneling magneto-resistive element of claim 4 as a read element.

7. A magnetic recording/reproducing apparatus including the magnetic head device of claim 6 and a magnetic recording medium.

8. A method for manufacturing a magneto-resistive element, comprising:
    forming a crystalline layer as one layer constituting a lower magnetic shielding film;
    forming an amorphous layer above said crystalline layer as another layer constituting said lower magnetic shielding film;
    forming a magneto-resistive film above said amorphous layer; and
    performing high-temperature main-annealing at a temperature exceeding 300° C.

9. A method for manufacturing a tunneling magneto-resistive element, comprising:
    forming a crystalline layer as one layer constituting a lower magnetic shielding film;
    forming an amorphous layer above said crystalline layer as another layer constituting said lower magnetic shielding film;
    forming a tunneling magneto-resistive film above said amorphous layer, said tunneling magneto-resistive film including an antiferromagnetic layer, a pinned layer, a barrier layer and a free layer; and
    performing high-temperature main-annealing at a temperature exceeding 300° C.

10. The method of claim 9, wherein after forming said crystalline layer or said amorphous layer and before forming said tunneling magneto-resistive film, sub-annealing is performed to form at least one crystal grain having a grain size of 500 nm or more in said crystalline layer.

11. The method of claim 10, wherein after said sub-annealing and before forming said tunneling magneto-resistive film, planarization is performed.

12. The method of claim 9, wherein said barrier layer is constituted of magnesium oxide.

* * * * *